(12) United States Patent
Andersen et al.

(10) Patent No.: US 10,111,016 B2
(45) Date of Patent: Oct. 23, 2018

(54) METHOD OF OPERATING A HEARING AID SYSTEM AND A HEARING AID SYSTEM

(71) Applicant: Widex A/S, Lynge (DK)

(72) Inventors: Kristian Timm Andersen, Copenhagen (DK); Thomas Bo Elmedyb, Herlev (DK)

(73) Assignee: Widex A/S, Lynge (DK)

( * ) Notice: Subject to any disclaimer, the term of this patent is extended or adjusted under 35 U.S.C. 154(b) by 0 days.

(21) Appl. No.: 15/642,572

(22) Filed: Jul. 6, 2017

(65) Prior Publication Data

US 2017/0311093 A1    Oct. 26, 2017

Related U.S. Application Data

(63) Continuation of application No. PCT/EP2015/050547, filed on Jan. 14, 2015.

(51) Int. Cl.
*H04R 25/00* (2006.01)
*H03H 21/00* (2006.01)

(52) U.S. Cl.
CPC ........... *H04R 25/505* (2013.01); *H04R 25/70* (2013.01); *H03H 2021/0083* (2013.01); *H03H 2218/02* (2013.01); *H04R 25/407* (2013.01); *H04R 2225/43* (2013.01); *H04R 2430/03* (2013.01)

(58) Field of Classification Search
CPC .... H04R 25/407; H04R 25/50; H04R 25/505; H04R 25/70; H04R 2225/43; H04R 2430/03; H03H 2218/02; H03H 2021/0083
USPC .............................. 381/74, 92, 313, 320, 321
See application file for complete search history.

(56) References Cited

U.S. PATENT DOCUMENTS

| | | | | |
|---|---|---|---|---|
| 7,716,046 B2* | 5/2010 | Nongpiur | ................ | G10L 19/26 381/94.1 |
| 8,553,901 B2* | 10/2013 | Hersbach | ............. | H04R 25/453 381/313 |
| 2003/0053647 A1 | 3/2003 | Kates | | |
| 2009/0067651 A1 | 3/2009 | Klinkby et al. | | |

FOREIGN PATENT DOCUMENTS

WO    2009/034524 A1    3/2009

OTHER PUBLICATIONS

International Search Report of PCT/EP2015/050547 dated May 11, 2015 [PCT/ISA/210].
Written Opinion of PCT/EP2015/050547 dated May 11, 2015 [PCT/ISA/237].

* cited by examiner

*Primary Examiner* — Jesse A Elbin
(74) *Attorney, Agent, or Firm* — Sughrue Mion, PLLC

(57) ABSTRACT

A method of operating a hearing aid system with virtually zero delay and phase distortion. The invention also provides a hearing aid system (100) adapted for carrying out such a method.

12 Claims, 3 Drawing Sheets

METHOD OF OPERATING A HEARING AID SYSTEM AND A HEARING AID SYSTEM

CROSS REFERENCE TO RELATED APPLICATIONS

This application is a continuation of International Application No. PCT/EP2015/050547, filed Jan. 14, 2015, the contents of all of which are incorporated herein by reference in its entirety.

The present invention relates to a method of operating a hearing aid system. The present invention also relates to a hearing aid system adapted to carry out said method.

BACKGROUND OF THE INVENTION

Generally a hearing aid system according to the invention is understood as meaning any device which provides an output signal that can be perceived as an acoustic signal by a user or contributes to providing such an output signal, and which has means which are customized to compensate for an individual hearing loss of the user or contribute to compensating for the hearing loss of the user. They are, in particular, hearing aids which can be worn on the body or by the ear, in particular on or in the ear, and which can be fully or partially implanted. However, those devices whose main aim is not to compensate for a hearing loss but which have, however, measures for compensating for an individual hearing loss are also concomitantly included, for example consumer electronic devices (televisions, hi-fi systems, mobile phones, MP3 players etc.).

Within the present context a traditional hearing aid can be understood as a small, battery-powered, microelectronic device designed to be worn behind or in the human ear by a hearing-impaired user. Prior to use, the hearing aid is adjusted by a hearing aid fitter according to a prescription. The prescription is based on a hearing test, resulting in a so-called audiogram, of the performance of the hearing-impaired user's unaided hearing. The prescription is developed to reach a setting where the hearing aid will alleviate a hearing loss by amplifying sound at frequencies in those parts of the audible frequency range where the user suffers a hearing deficit. A hearing aid comprises one or more microphones, a battery, a microelectronic circuit comprising a signal processor, and an acoustic output transducer. The signal processor is preferably a digital signal processor. The hearing aid is enclosed in a casing suitable for fitting behind or in a human ear.

Within the present context a hearing aid system may comprise a single hearing aid (a so called monaural hearing aid system) or comprise two hearing aids, one for each ear of the hearing aid user (a so called binaural hearing aid system). Furthermore the hearing aid system may comprise an external device, such as a smart phone having software applications adapted to interact with other devices of the hearing aid system. Thus within the present context the term "hearing aid system device" may denote a hearing aid or an external device.

The mechanical design has developed into a number of general categories. As the name suggests, Behind-The-Ear (BTE) hearing aids are worn behind the ear. To be more precise, an electronics unit comprising a housing containing the major electronics parts thereof is worn behind the ear. An earpiece for emitting sound to the hearing aid user is worn in the ear, e.g. in the concha or the ear canal. In a traditional BTE hearing aid, a sound tube is used to convey sound from the output transducer, which in hearing aid terminology is normally referred to as the receiver, located in the housing of the electronics unit and to the ear canal. In some modern types of hearing aids a conducting member comprising electrical conductors conveys an electric signal from the housing and to a receiver placed in the earpiece in the ear. Such hearing aids are commonly referred to as Receiver-In-The-Ear (RITE) hearing aids. In a specific type of RITE hearing aids the receiver is placed inside the ear canal. This category is sometimes referred to as Receiver-In-Canal (RIC) hearing aids.

In-The-Ear (ITE) hearing aids are designed for arrangement in the ear, normally in the funnel-shaped outer part of the ear canal. In a specific type of ITE hearing aids the hearing aid is placed substantially inside the ear canal. This category is sometimes referred to as Completely-In-Canal (CIC) hearing aids. This type of hearing aid requires an especially compact design in order to allow it to be arranged in the ear canal, while accommodating the components necessary for operation of the hearing aid.

Hearing loss of a hearing impaired person is quite often frequency-dependent. This means that the hearing loss of the person varies depending on the frequency. Therefore, when compensating for hearing losses, it can be advantageous to utilize frequency-dependent amplification. Hearing aids therefore often provide to split an input sound signal received by an input transducer of the hearing aid, into various frequency intervals, also called frequency bands, which are independently processed. In this way it is possible to adjust the input sound signal of each frequency band individually to account for the hearing loss in respective frequency bands. The frequency dependent adjustment is normally done by implementing a band split filter and compressors for each of the frequency bands, so-called band split compressors, which may be summarised to a multi-band compressor. In this way it is possible to adjust the gain individually in each frequency band depending on the hearing loss as well as the input level of the input sound signal in a specific frequency range. For example, a band split compressor may provide a higher gain for a soft sound than for a loud sound in its frequency band.

The filter banks used in such multi-band compressors are well known within the art of hearing aids, but are nevertheless based on a number of tradeoffs. Most of these tradeoffs deal with the frequency resolution as will be further described below.

There are some very clear advantages of having a high resolution filter bank. The higher the frequency resolution, the better individual periodic components can be distinguished from each other. This gives a much finer signal analysis and enables more advanced signal processing. Especially noise reduction and speech enhancement schemes may benefit from a higher frequency resolution.

However, a filter bank with a high frequency resolution generally introduces a correspondingly long delay, which for most people will have a detrimental effect on e.g. the achievable speech intelligibility.

It has therefore been suggested to reduce the delay incurred by traditional filter banks, such as Discrete Fourier Transform (DFT) and Finite Impulse Response (FIR) filter banks by:

applying a time-varying FIR filter with a response that corresponds to the desired frequency dependent gains that were otherwise to be applied to the frequency bands provided by the traditional filter banks. However, this solution still requires that the frequency dependent gains are calculated in an analysis part of the system, and in case the analysis part comprises traditional analysis filter banks, then the determined frequency dependent gains will be delayed relative to the signal that the gains are to be applied to using the time-varying FIR filter. Furthermore, the FIR filter in itself will inherently introduce a delay although this delay is significantly shorter than the delay introduced by traditional filter banks.

It has been suggested in the art to minimize the delay introduced by the time-varying filters by using minimum-phase filters. However, this type of filter reduces the delay but still provides a frequency dependent non-linear phase shift and therefore introduces phase distortion.

It is furthermore noted that a traditional zero-phase filter is not applicable in this context, because the filter has to operate in real-time, which is not possible for a traditional non-causal zero-phase filter.

It is therefore a feature of the present invention to provide a method of operating a hearing aid system that provides signal processing with zero delay and phase distortion.

It is another feature of the present invention to provide a hearing aid system adapted to provide a method of operating a hearing aid system that has zero delay and phase distortion.

SUMMARY OF THE INVENTION

The invention, in a first aspect, provides a method of operating a hearing aid system, comprising the steps of: providing an input signal, branching the input signal and hereby providing, in a first branch, the input signal to an all-pass filter and, in a second branch, providing the input signal to a signal processor, and in a third branch, providing the input signal to a first summation unit, wherein the all-pass filter is configured to introduce the same delay as the signal processor, further branching the all-pass filter output signal and hereby providing, in a fourth branch, the all-pass filter output signal to a first adaptive filter, and providing, in a fifth branch, the all-pass filter output signal to a an adaptive filter coefficient calculator, providing the first adaptive filter output signal to the first summation unit and hereby providing a first error signal as the first adaptive filter output signal subtracted from the input signal, optimizing the filter coefficients of the first adaptive filter, using the adaptive filter coefficient calculator, based on the first error signal and the all-pass filter output signal, processing the input signal in the signal processor and providing the signal processor output signal to a second adaptive filter, wherein the second adaptive filter is provided with the same filter coefficients as the first adaptive filter, and providing the second adaptive filter output signal and the first error signal for further processing in the hearing aid system.

This provides an improved method of operating a hearing aid system with respect to processing delay and phase distortion.

The invention, in a second aspect, provides a hearing aid system comprising: an acoustical-electrical input transducer, an all-pass filter, a first and second adaptive filter, an adaptive filter coefficient calculator, a signal processor, a first summation point and a second summation point, wherein the hearing aid system is configured such that: the output signal from the acoustical-electrical input transducer is provided, in a first branch, to the all-pass filter, in a second branch, to the signal processor, and, in a third branch, to the first summation unit, such that the output signal from the all-pass filter is provided, in a fourth branch, to the first adaptive filter and, in a fifth branch, to the adaptive filter coefficient calculator, wherein the all-pass filter is adapted to introduce the same delay as the signal processor, such that: the output signal from the first adaptive filter is provided to the first summation unit, wherein the summation unit is adapted to subtract the output signal from the first adaptive filter from the output signal from the acoustical-electrical input transducer, such that the output signal from the first summation unit is provided to the adaptive filter coefficient calculator, wherein the adaptive filter coefficient calculator is adapted to determine the filter coefficients of the first adaptive filter based on the output signals from first summation unit and the all-pass filter, such that the output signal from the signal processor is provided to the second adaptive filter, wherein the second adaptive filter is provided with the same filter coefficients as the first adaptive filter, and such that the output signals from the second adaptive filter and the first summation unit are provided for further processing in the hearing aid system.

This provides a hearing aid system with improved means for operating a hearing aid system.

Further advantageous features appear from the dependent claims. Still other features of the present invention will become apparent to those skilled in the art from the following description wherein the invention will be explained in greater detail.

BRIEF DESCRIPTION OF THE DRAWINGS

By way of example, there is shown and described a preferred embodiment of this invention. As will be realized, the invention is capable of other embodiments, and its several details are capable of modification in various, obvious aspects all without departing from the invention. Accordingly, the drawings and descriptions will be regarded as illustrative in nature and not as restrictive. In the drawings.

DETAILED DESCRIPTION

Figure 1:
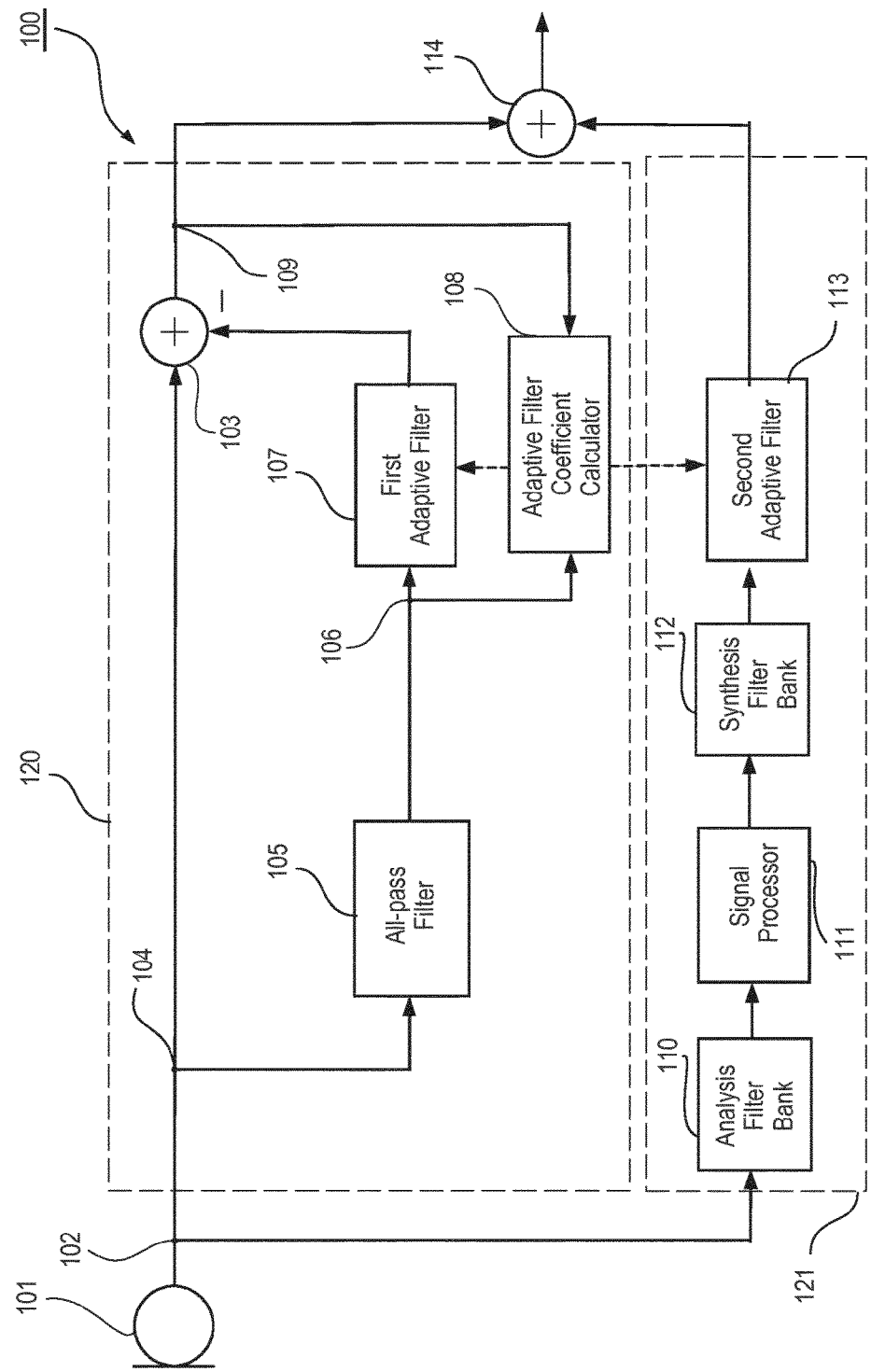
FIG. 1 illustrates highly schematically a selected part of a hearing aid according to an embodiment of the invention.

In the present context the term signal processing is to be understood as any type of hearing aid system related signal processing that includes at least: noise reduction, speech enhancement and hearing compensation. Reference is first made to FIG. 1, which illustrates highly schematically a selected part of a hearing aid 100 according to an embodiment of the invention.

The selected part of the hearing aid 100 comprises an acoustical-electrical input transducer 101, i.e. a microphone, a first node 102, a first summing unit 103, a second node 104, an all-pass filter 105, a third node 106, a first adaptive filter 107, an adaptive filter coefficient calculator 108, a fourth node 109, an analysis filter bank 110, a signal processor 111, an synthesis filter bank 112, a second adaptive filter 113 and a second summing unit 114.

Not shown in FIG. 1 is, that the signal provided by the second summing unit 114 is provided to an electro-acoustical output transducer, i.e. the hearing aid speaker.

In the following the second node 104, the first summing unit 103, the all-pass filter 105, the third node 106, the first adaptive filter 107, the adaptive filter coefficient calculator 108 and the fourth node 109 may together be denoted a periodic signal estimator 120. In a similar manner the analysis filter bank 110, the signal processor 111, the synthesis filter bank 112 and the second adaptive filter 113 may in the following be denoted an adaptively filtered processor 121.

According to the embodiment of FIG. 1 the microphone 101 provides an analog electrical signal that is converted into a digital input signal by an analog-digital converter (not shown). However, in the following, the term digital input signal may be used interchangeably with the term input signal and the same is true for all other signals referred to in that they may or may not be specifically denoted as digital signals.

The digital input signal is branched in the first node 102, whereby the input signal, in a first branch, is provided to the second node 104 and from here further on, along the first branch, to the first summing unit 103, whereby the input signal, from the second node 104 and in a second branch, is provided to the all-pass filter 105, and whereby the input signal from the first node 102, in a third branch, is provided to the analysis filter bank 110.

The all-pass filter output signal is provided to the third node 106 and from here further on, in a fourth branch, to the first adaptive filter 107 and, in a fifth branch, to the adaptive filter coefficient calculator 108.

The output from the first adaptive filter is provided to the first summing unit 103 whereby a first error signal for the adaptive filter coefficient calculator 108 is provided as the output from the first adaptive filter subtracted from the input signal. Thus the output signal from the first summing unit 103 is branched in the fourth node 109 and hereby provided to both the adaptive filter coefficient calculator 108 and to the second summing unit 114.

The output from the analysis filter bank 110 is provided to the signal processor 111 and from there further on to the synthesis filter bank 112 and the second adaptive filter 113 and finally provided to the second summing unit 114, whereby the output signal from the second summing unit 114 is the sum signal of the input signal and the output signal from the second adaptive filter, and with the output signal from the first adaptive filter subtracted from that sum signal.

It is an essential feature of the present invention that the all-pass filter 105 is configured to provide the same delay as the combined processing of the analysis filter bank 110, the signal processor 111 and the synthesis filter bank 112. It will be well known for a person skilled in the art, that the use of the term all-pass filter implies that the filter applies the same gain, preferably a unity (zero dB) gain to all relevant signal frequencies and only changes the phase relationship between various frequency components.

Having this configuration the adaptive filter coefficient calculator 108 will optimize both the first adaptive filter 107 and the second adaptive filter 113 such that the output signal from the second summing unit 114 has the property of no delay and zero phase distortion.

The concept of adaptive filtering is well known within the art of hearing aid systems and it will be readily understood by a person skilled in the art that an adaptive filter and the method of optimizing the adaptive filter coefficients may be implemented in many different ways. However, one way to explain the general concept may be by considering the case where an adaptive filter and the corresponding adaptive filter coefficient calculator operates by taking a number of delayed samples from a first input signal and optimizes the linear combination of these samples in order to minimize an error signal provided to the adaptive filter.

The output from the second summing unit 114 may be directed to the hearing aid receiver or may undergo further processing before that. Examples of such further processing are frequency transposition and frequency compression, because these types of processing change the phase such that the phase compensation carried out by the adaptive filtering no longer provides the desired result of virtually zero delay and phase distortion. Hearing loss compensation may, or may not, be an example of such further processing.

The invention may be understood by considering a periodic signal that is sent through a filter bank with a linear-phase delay of D samples. Due to the periodicity of the signal the delay through the filter bank can be canceled completely by shifting the phase of the output signal from the filter bank forward in time by the frequency dependent phase difference between the input signal and the output signal of the filter bank. This results in an output signal that appears to have passed through the filter bank with a zero delay. It is noted that any gain may be applied to the signal in the filter bank and because the phase shift cancels the delay, the signal will be identical to a zero-phase filtered signal.

However, real-world signals such as the input signals for hearing aid systems are only periodic for a limited time and for this more general problem the inventors have found that an adaptive filter is a suitable choice for a filter that can shift the phase of a processed signal in order to cancel an introduced delay because the adaptive filter can provide both a suitable magnitude and phase response for the processed signal. The adaptive filter may provide such a suitable response by optimizing the adaptive filter coefficients in order to predict the processed signal D samples in advance. Hereby signal components with a periodicity with shorter than D samples will not be predicted and in the following such signal components may be denoted stochastic signal components.

Thus according to the embodiment of FIG. 1 the adaptive filter coefficient calculator 108 is configured to provide adaptive prediction such that the output signals from the first and second adaptive filters respectively comprise periodic signal components that are phase shifted to be in phase with the input signal.

In the following it is assumed that the digital input signal x(n) can be separated into an estimated periodic signal $\hat{x}(n)$ and a stochastic signal e(n) that the adaptive filter cannot predict.

According to the embodiment of FIG. 1 the first adaptive filter 107 provides as output the estimated periodic signal $\hat{x}(n)$ in accordance with the formula:

$$x(n) = \hat{x}(n) + e(n) = \sum_{k=0}^{K-1} h_k(n) x_A(n-k) + e(n)$$

wherein $x_A(n)$ is the output signal from the all-pass filter 105, and $\overline{h}(n) = [h_0(n), h_1(n), \ldots, h_{K-1}(n)]^T$ is a vector holding the adaptive filter coefficients.

The adaptive filter coefficients are calculated in order to optimize the expected energy of the stochastic signal:

$$C(n) = E\{|e(n)|^2\}$$

wherein C(n) is the cost function to be minimized and E{ } represents the expectation operator.

According to the embodiment of FIG. 1 the update equation for the adaptive filter coefficients is given as:

$$\bar{h}(n+1) = (1-\gamma)\bar{h}(n) + \mu \frac{\bar{x}_D(n)e(n)}{\bar{x}_D(n)\bar{x}_D(n)^T + \alpha}$$

wherein $\hat{x}_D(n) = [x(n-D), x(n-D-1), \ldots, x(n-D-K+1)]^T$, $\gamma$ is a leakage factor, $\alpha$ is an offset and $\mu$ is the step size. According to the embodiment of FIG. 1 the value of the step size $\mu$ is selected to be 0.05, the value of the leakage factor $\gamma$ is selected to be 0.002, the value of the offset $\alpha$ is selected to be 0.05, the value of K is selected to be 128. However, all of the above values depend on the selected sampling frequency, according to the present embodiment 32 kHz.

According to variations of the embodiment of FIG. 1 the value of the step size $\mu$ is selected from the range between 0 and 2, or preferably from the range between 0.01 and 0.5, specifically the values may be 0.01, or 0.1, the value of the leakage factor $\gamma$ is selected from the range between 0 and 1, or preferably from the range between 0 and 0.1, specifically the values may be selected in accordance with the expression $2^{-N}$, wherein N is a natural number between 3 and 9, the value of the offset $\alpha$ is selected from the range between 0 and 1, and the value of K is selected from the range between 1 and 4096, or preferably from the range between 16 and 512, specifically the values may be 32 or 64.

Furthermore it is noted that the parameters of adaptive algorithms generally may be adapted to also depend on time and frequency as will be obvious for a person skilled in the art.

According to the embodiment of FIG. 1 the adaptive filter coefficient calculator 108 operates in accordance with a variant of the well-known normalized least-mean-square (NLMS) algorithm. In variations of the present embodiment other adaptive algorithms may be applied such as linear prediction analysis and maximum a posteriori (MAP), but the selected variant of the NLMS algorithm is advantageous due to its low computational complexity and because it does not introduce any further delay.

According to the embodiment of FIG. 1 the delay D is set to be 5 milliseconds (ms). In variations the delay is selected from the range between 0 and 25 milliseconds or in the range between 4 and 10 milliseconds. A delay D in the range of say 4-10 milliseconds will typically result in prediction of input signal components like voiced speech while signal components like noise will not be predicted. However, whether a certain delay D will allow voiced speech to be predicted depends on a number of factors such as: the individual speaker, the sex of the individual speaker, how fast the speaker speaks and the spoken word. In fact some voiced speech signals may be predicted for delays up to 50 or even 100 milliseconds.

Please note that in order for D to fit in the update equation for the adaptive filter, the delay must be given in samples instead of milliseconds, and in the former case the delay will consequently depend on the sampling rate.

Generally the following observations concerning the functioning of the adaptive filter can be made: (i) periodic signal components that have a significant auto-correlation for a lag larger than D can be predicted, (ii) signal components with no significant auto-correlation for a lag larger than D will be at least partly suppressed by the adaptive filter in order to minimize the above given cost function, and (iii) the adaptive filter will adjust the phase of the output signal from the first adaptive filter such that it matches the input signal as much as possible in order to minimize the cost function.

Figure 2:
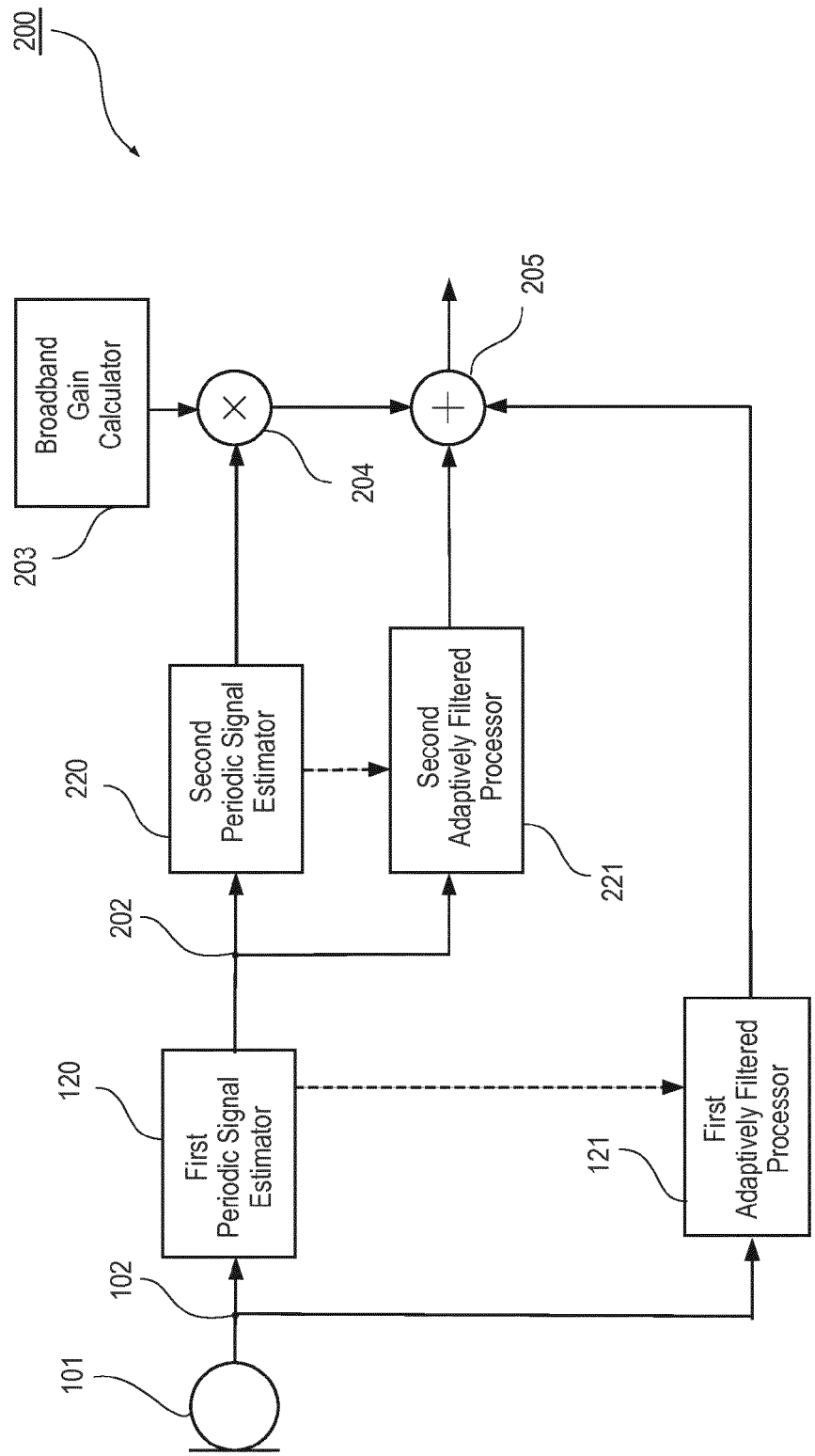
FIG. 2 illustrates highly schematically a selected part of a hearing aid according to an embodiment of the invention.

Reference is now given to FIG. 2, which illustrates highly schematically a selected part of a hearing aid 200 according to an embodiment of the invention.

The hearing aid 200 comprises an acoustical-electrical input transducer 101, i.e. a microphone, a first node 102, a first periodic signal estimator 120, a first adaptively filtered processor 121, a second node 202, a second periodic signal estimator 220, a second adaptively filtered processor 221, a broadband gain calculator 203, a broadband gain multiplier 204, and a summing unit 205.

The first periodic signal estimator 120 is configured as already given with reference to FIG. 1 and the second periodic signal estimator 220 comprises the same type of components organized in the same way. Only difference between the two is the parameter settings as will be further discussed below.

Equivalently the first adaptively filtered processor 121 is configured as already given with reference to FIG. 1 and the second adaptively filtered processor 221 comprises the same type of components organized in the same way. Only difference between the two is the parameter settings as will be further discussed below.

The advantageous effect obtained with the embodiment according to FIG. 2 may be best understood by considering how to determine the optimal value of the delay D in the embodiment according to FIG. 1. The value of the delay D has consequences both for the adaptive filtering and for the processing that is carried out in the third branch.

The adaptive filters seek to suppress signal components without a significant auto-correlation for a lag larger than D, and consequently more signal components will be allowed to pass through the adaptive filters in case a shorter D is selected. However, D is also determined by the delay from the analysis filter bank 110, the signal processing 111 and the synthesis filter bank 112, and a consequence of a shorter D will normally be that the frequency resolution of the filter bank has to be reduced accordingly.

Thus a relatively large value of D can provide improved signal processing due to the improved frequency resolution of the filter bank. This is especially true when the signal processing comprises speech enhancement or noise suppression. However, this beneficial effect comes at the cost that a relatively small part of the signal components are allowed to pass through the adaptive filter.

Thus the embodiment of the invention according to FIG. 1 presents a tradeoff that must be determined in some way. However, this tradeoff may be softened using the embodiment of FIG. 2, wherein two sets of a periodic signal estimator 120 and 220 and a corresponding adaptively filtered processor 121 and 221 are operated in cascade, and wherein the first periodic signal estimator 120 and the first adaptively filtered processor 121 operate based on a delay D1 that is set to 5 milliseconds and wherein the second periodic signal estimator 220 and the second adaptively filtered processor 221 operates based on a delay D2 that is set to 3 milliseconds.

In variations the delay D1 may be in the range between 4 and 10 milliseconds and the delay D2 may be in the range between 2 and 4 milliseconds.

According to the embodiment of FIG. 2 the input signal from the microphone 101 is branched in the first node 102 and provided to the first periodic signal estimator 120 and to the first adaptively filtered processor 121

The output signal from the first periodic signal estimator 120 comprises the stochastic signal components, i.e. the signal components that have a periodicity shorter than D1. The output signal from the first periodic signal estimator 120 is branched in the second node 202 and provided to the second periodic signal estimator 220 and to the second adaptively filtered processor 221.

Consequently the output signal from the second periodic signal estimator 220 will comprise only the stochastic signal components that have a periodicity shorter than D2. The output signal from the second periodic signal estimator 220 will typically be dominated by noise, transient signals and onsets like short bursts and plosives in speech. The output signal from the second periodic signal estimator 220 consists of components that only have a significant auto-correlation for lags smaller than D1 and D2, which means that the power spectral density of these components will be relatively flat. Therefore the inventors have found that the output signal from the second periodic signal estimator 220 may be processed by applying a broadband gain using the broadband gain multiplier 204 and wherein the broadband gain is determined by the broadband gain calculator 203, hereby providing a processed stochastic signal.

It is well known within the art of hearing aid systems that the stochastic signal will be dominated by noise and transients but also comprises short noise like speech components such as /s/ and /t/. One approach is therefore to generally reduce the stochastic signal level and then increase the stochastic signal level when speech components are detected. However, in a variation it may be selected to only apply a constant negative gain, but this will probably have a negative impact on the speech intelligibility.

The output signals from the first and second adaptively filtered processors 121 and 221 are added together in the first summing unit 205 and subsequently added with the processed stochastic signal in second summing unit 206.

The output from the second summing unit 206 may be directed to the hearing aid receiver or may undergo further processing before that, as already discussed with reference to the embodiment of FIG. 1.

According to the embodiment of FIG. 2 the values of the parameters used to determine the adaptive filter coefficients in the first periodic signal estimator 120 are the same as those given with reference to the embodiment of FIG. 1, and the values of the parameters used to determine the adaptive filter coefficients in the second periodic signal estimator 220 are also the same as those given with reference to the embodiment of FIG. 1, except that the step size μ is selected to be 0.25 and the value of K is selected to be 64.

In variations of the embodiment of FIG. 2, the broadband processing of the output signal from the second periodic signal estimator 220 may be omitted.

In variations of the disclosed embodiments, the input signal is not provided directly from the microphone 101. Instead the input signal is provided as the output signal from a beam-former. The various types of traditional beam-formers are well known within the art of hearing aid systems.

In another variation of the disclosed embodiments the first adaptive filter 107 is replaced by a set of sub-band adaptive filters positioned in each of the frequency bands provided by an analysis filter bank that together with an all-pass filter and a synthesis filter bank provide the same functionality as the all-pass filter 105 of the embodiment of FIG. 1. In this case the second adaptive filter 113 correspondingly needs to be replaced by a set of sub-band adaptive filters positioned in each of the frequency bands provided by the analysis filter bank 110 of the disclosed embodiments. The set of sub-band adaptive filters may be positioned before or after the signal processor 111 of the disclosed embodiments. In this case the sub-band adaptive filters can have significantly fewer coefficients than the corresponding broad band adaptive filters. The NLMS algorithm can be implemented in sub-bands and in yet a further variation the sign-sign LMS algorithm can be implemented instead of the NLMS algorithm.

According to a specific variation, the frequency dependent gain that is applied in order to compensate an individual hearing loss is not part of the signal processing according to the disclosed embodiments. Instead this gain is applied to the output signal from the summation points 114 and 205, respectively, according to the disclosed embodiments. Hereby it is expected that the presence of processing artefacts can be minimized.

According to yet another variation the frequency dependent gain for compensating an individual hearing loss is applied before the first node 102. This may be advantageous since it may allow e.g. the NLMS algorithm to adapt faster to the higher frequency components of the input signal because the adaptation speed of the NLMS algorithm generally increases with the signal energy and because most hearing impaired have a high frequency loss, which has as consequence that the frequency dependent gain for compensating an individual hearing loss will raise the signal energy for the higher frequency components.

However, in case the frequency dependent gain that is applied in order to compensate an individual hearing loss is in fact part of the signal processing according to the disclosed embodiments, then a corresponding frequency dependent gain may be applied between the first and second summation points 103 and 114 according to the embodiment of FIG. 1 and in this case a second all-pass filter must be inserted after the second adaptive filter 113, wherein the second all-pass filter is adapted to introduce the same delay, as the delay introduced by applying the frequency dependent gain between the first and second summation points 103 and 114

In a further variation a broadband gain is applied instead of a frequency dependent gain because the stochastic signal components are expected to be relatively white, which provides a more simple implementation.

In still further variations of the disclosed embodiments the analysis filter bank 110 and the synthesis filter bank 112 of the adaptively filtered processors 121 and 221 may be omitted, e.g. if the corresponding signal processors 111 includes a time-varing filter adapted to apply a desired frequency dependent gain.

Figure 3:
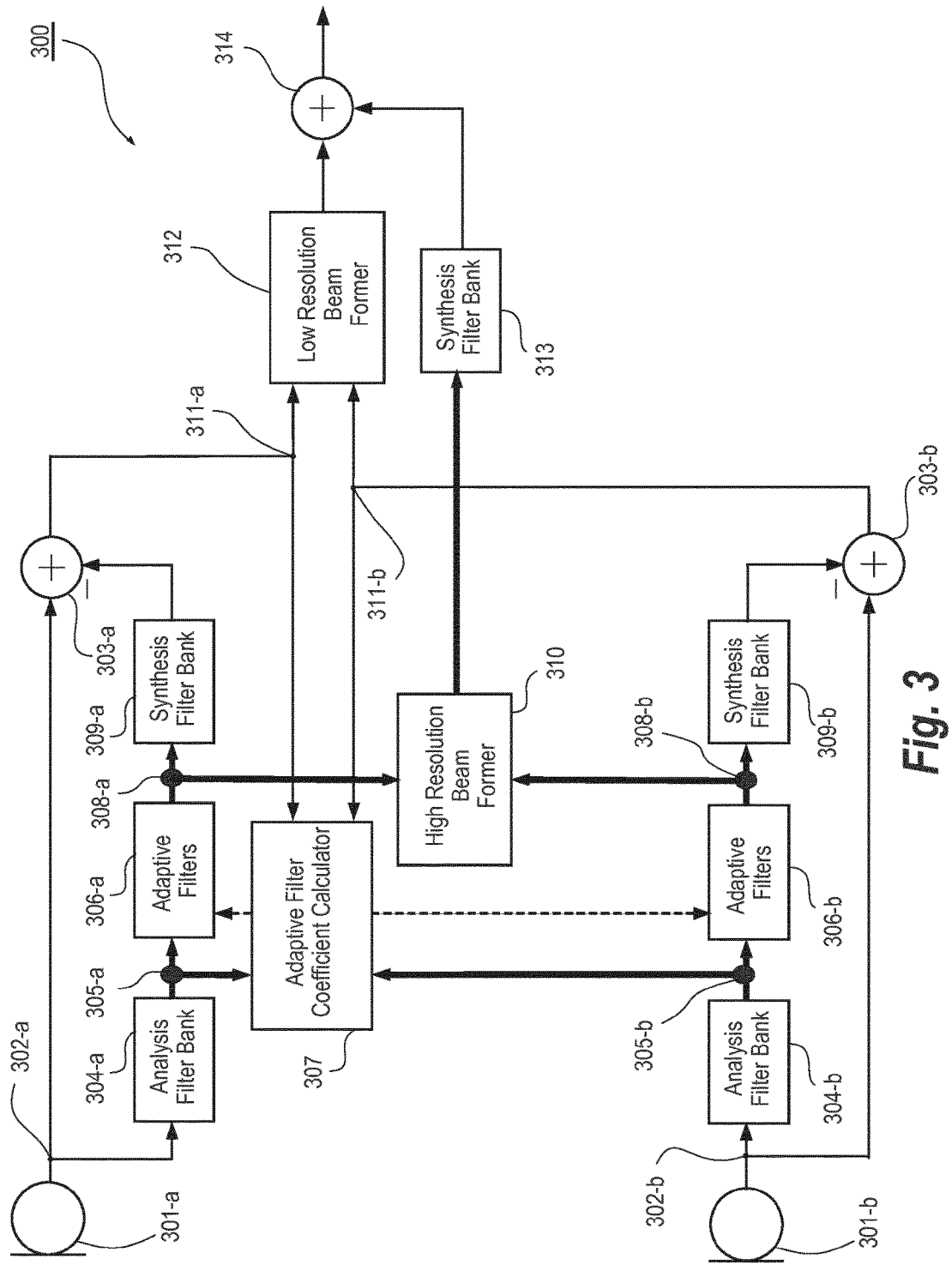
FIG. 3 illustrates highly schematically a selected part of a hearing aid according to another embodiment of the invention.

Reference is now made to FIG. 3 that illustrates highly schematically selected parts of a hearing aid 300 according to an embodiment of the invention.

The hearing aid 300 comprises a first and a second microphone 301-*a* and 302-*b*, and the input signals provided from the microphones 301-*a* and 301-*b* are treated in the same manner and in the following the functionality of the various signal processing entities will consequently be described only once, while referring to both branches of the selected part of the hearing aid. The signal processing entities that use the output signal from the first microphone 301-*a* will be denoted using suffix "a", while the signal processing entities that use the output signal from the second microphone 301-*b* will be denoted using the suffix "b".

The output signals from the microphones 301-*a* and 301-*b* are branched in the first nodes 302-*a* and 302-*b*, whereby the output signals are provided to both the first summing units 303-*a* and 303-*b* and to the analysis filter banks 304-*a* and 304-*b* that provides as output a plurality of frequency band signals, which in the following will be illustrated as bold lines. The plurality of frequency band signals are branched in the second nodes 305-*a* and 305-*b*, whereby the frequency band signals are provided to both a corresponding set of adaptive filters 306-*a* and 306-*b* and to an adaptive filter coefficient calculator 307 that, in response to the frequency band signals and the output signals from the first summing units 303-*a* and 303-*b*, calculates the filter coefficients for the adaptive filters 306-*a* and 306-*b* and subsequently sets the filter coefficients in the adaptive filters 306-*a* and 306-*b*, which is illustrated in the figure by dotted lines. The output signals from the adaptive filters 306-*a* and 306-*b* are provided to the third nodes 308-*a* and 308-*b*, whereby the output signals from the adaptive filters 306-*a* and 306-*b* are provided both to a high resolution beam former 310 and to the first synthesis filter banks 309-*a* and 309-*b*.

The output signals from the synthesis filter banks 309-*a* and 309-*b* are provided to the first summing units 303-*a* and 303-*b*, whereby error signals for the adaptive filter coefficient calculator 307 is provided as the output signals from the first synthesis filter banks 309-*a* and 309-*b* subtracted from the corresponding output signals from the microphones 301-*a* and 301-*b*. However, via fourth nodes 311-*a* and 311-*b*, the output signals from the first summing units 303-*a* and 303-*b* are also provided to a low resolution beam former 311, wherein the low resolution beam former 312, according to the present embodiment, is characterized in that it is a single band, and hence low resolution, beam former as opposed to the multi-band high resolution beam former 310.

The output signals from the high resolution beam former 310 is provided to a second synthesis filter bank 313 and the output signal from the second synthesis filter bank 313 is provided to the second summing unit 314 where the signal is added with the output signal from the low resolution beam former 312.

Finally the output signal from the second summing unit 314 is directed to the remaining parts of the hearing aid 300. The output signal from the second summing unit 314 is characterized in that beamforming is obtained while having virtually zero delay despite the fact, that the analysis- and synthesis filter banks 304-*a*, 304-*b*, 309-*a*, 309-*b* and 313, which introduce significant processing delays are used, in order to provide high frequency resolution beam forming. This is obtained using principles similar to those already disclosed with reference to the embodiments of FIGS. 1 and 2 and their variations. Thus the high resolution beam forming is only obtained for the signal components having a periodicity (or auto-correlation), that is longer than the delay introduced by the filter banks. For the stochastic signal components low frequency resolution beam forming is generally more acceptable for most users.

In a variation of the FIG. 3 embodiment, the adaptive filter coefficient calculator 307 may be replaced by a more simple version that only receives input signal from one of the branches, i.e. e.g. only from the analysis filter bank 304-*a* and from the fourth node 311-*a*, and wherein the determined adaptive filter coefficients are then used in both the adaptive filters 306-*a* and 306-*b*.

In another variation of the FIG. 3 embodiment, the output signals from the first summing units 303-*a* and 303-*b* are split into a plurality of frequency bands, by a pair of low delay analysis filter banks, before being provided to a corresponding multi-band version of the low resolution beam former 312, and the multi-band output therefrom is subsequently synthesized in a low delay synthesis filter bank and provided to the second summing unit 314. However, this modification requires, in order to maintaining the phase relationship between the periodic and stochastic signal components, that an all-pass filter with a delay corresponding to the delay introduced by the low delay analysis and synthesis filter banks are inserted between the second synthesis filter bank 313 and the second summing unit 314. Hereby beamforming with a minimum of delay and phase distortion may be obtained. Thus by introducing a minimum delay the quality of the beamforming may be improved due to the increased frequency resolution of the multi-band version of the low resolution beam former 312.

The concept of beam forming is well known within the art of hearing aid systems and the embodiments of the present invention are independent on the exact implementation of both the multi-band high resolution beam former 310 and the low resolution beam former 312. The fact that the concept of beam forming is well known within the art of hearing aid systems has as consequence that a person skilled in the art will readily understand how the selected parts of the hearing aid according to the embodiment of FIG. 3 interact with the remaining parts of the hearing aid.

As one example, beam forming may be achieved by using the output signals from two omnidirectional microphones to form an omni-directional signal by adding the two output signals and to form a bi-directional signal by subtracting the two output signals and then achieve the desired beam form by weighting the two signals together. Obviously this method is suitable for both single and multi-band beam formers.

The disclosed embodiments may in particular be advantageous in so called cocktail party situations because the ability to distinguish different speakers is based on different aspects in dependence on whether voiced or unvoiced speech is considered. According to the present invention, and as already discussed above, the periodic signals will comprise a significant part of the voiced speech components, whereas the stochastic signals will comprise a significant part of the unvoiced speech components.

It is speculated that voiced speech components from different speakers are primarily distinguished by using the fact that voiced speech components from different speakers typically do not overlap in frequency, whereby one speaker may be enhanced over the other if the frequency resolution is sufficiently high. On the other hand it is speculated that unvoiced speech components from different speakers typically do not overlap in time, wherefrom it follows that a high frequency resolution may not be required in order to distinguish unvoiced speech components.

In further variations the methods and selected parts of the hearing aid according to the disclosed embodiments may also be implemented in systems and devices that are not hearing aid systems (i.e. they do not comprise means for compensating a hearing loss), but nevertheless comprise both acousto-electrical input transducers and electro-acoustical output transducers. Such systems and devices are at present often referred to as hear-ables. However, a headset is another example of such a system.

Other modifications and variations of the structures and procedures will be evident to those skilled in the art.

The invention claimed is:

1. A method of operating a hearing aid system comprising the steps of:
   providing an input signal,
   branching the input signal and hereby providing, in a first branch, the input signal to an all-pass filter and, in a second branch, providing the input signal to a signal processor, and in a third branch, providing the input signal to a first summation unit, wherein the all-pass filter is configured to introduce the same delay as the signal processor, further branching the all-pass filter output signal and hereby providing, in a fourth branch, the all-pass filter output signal to a first adaptive filter, and providing, in a fifth branch, the all-pass filter output signal to a an adaptive filter coefficient calculator, providing the first adaptive filter output signal to the first summation unit and hereby providing a first error signal as the first adaptive filter output signal subtracted from the input signal, optimizing the filter coefficients of the first adaptive filter, using the adaptive filter coefficient calculator, based on the first error signal and the all-pass filter output signal, processing the input signal in the signal processor and providing the signal processor output signal to a second adaptive filter, wherein the second adaptive filter is provided with the same filter coefficients as the first adaptive filter, and providing the second adaptive filter output signal and the first error signal for further processing in the hearing aid system.

2. The method according to claim 1 comprising the further step of: summing the second adaptive filter output signal and the first error signal in a second summation unit, hereby providing a processed input signal.

3. The method according to claim 2, comprising the further step of applying a frequency dependent gain to the processed input signal in order to compensate an individual hearing loss.

4. The method according to claim 1, comprising the further step of applying a frequency dependent gain to the input signal, before the input signal is branched, in order to compensate an individual hearing loss.

5. The method according to claim 1, wherein the step of processing the input signal in the signal processor comprises applying a frequency dependent gain in order to compensate an individual hearing loss.

6. The method according to claim 1, wherein the delay introduced by the all-pass filter is in the range between 1 and 50 milliseconds.

7. The method according to claim 1, wherein the step of processing the input signal in the signal processor comprises the steps of:

splitting the input signal into a plurality of frequency band signals using an analysis filter bank, combining a plurality of processed frequency band signals using a synthesis filter bank.

8. The method according to claim 1, wherein the step of processing the input signal in the signal processor comprises applying a frequency dependent gain in order to suppress noise or enhance speech intelligibility.

9. The method according to claim 1, comprising the further steps of:

branching the first error signal and hereby providing, in a sixth branch, the first error signal to a second all-pass filter and providing, in a seventh branch, the first error signal to a second signal processor, and providing, in an eight branch, the first error signal to a third summation unit, wherein the second all-pass filter is configured to provide the same delay as the second signal processor, branching the second all-pass filter output signal and hereby providing, in a ninth branch, the second all-pass filter output signal to a third adaptive filter and providing, in a tenth branch, the second all-pass filter output signal to a second adaptive filter coefficient calculator, providing the third adaptive filter output signal to the third summation unit, and providing a second error signal as the third adaptive filter output signal subtracted from the first error signal, optimizing the filter coefficients of the third adaptive filter, using the second adaptive filter coefficient calculator, based on the second error signal and the second all-pass filter output signal, processing the first error signal in the second signal processor and providing the second signal processor output signal to a fourth adaptive filter, wherein the fourth adaptive filter is provided with the same filter coefficients as the third adaptive filter, summing the second adaptive filter output signal, the fourth adaptive filter output signal and the second error signal in a fourth summation unit hereby providing a second processed input signal.

10. A hearing aid system comprising:

an acoustical-electrical input transducer, an all-pass filter, a first and second adaptive filter, an adaptive filter coefficient calculator, a signal processor, a first summation point and a second summation point, wherein the hearing aid system is configured such that:

the output signal from the acoustical-electrical input transducer is provided, in a first branch, to the all-pass filter, in a second branch, to the signal processor, and, in a third branch, to the first summation unit, such that the output signal from the all-pass filter is provided, in a fourth branch, to the first adaptive filter and, in a fifth branch, to the adaptive filter coefficient calculator, wherein the all-pass filter is adapted to introduce the same delay as the signal processor, such that:

the output signal from the first adaptive filter is provided to the first summation unit, wherein the summation unit is adapted to subtract the output signal from the first adaptive filter from the output signal from the acoustical-electrical input transducer, such that the output signal from the first summation unit is provided to the adaptive filter coefficient calculator, wherein the adaptive filter coefficient calculator is adapted to determine the filter coefficients of the first adaptive filter based on the output signals from first summation unit and the all-pass filter, such that the output signal from the signal processor is provided to the second adaptive filter, wherein the second adaptive filter is provided with the same filter coefficients as the first adaptive filter, and such that the output signals from the second adaptive filter and the first summation unit are provided for further processing in the hearing aid system.

11. The hearing aid system according to claim 10 configured such that the output signals from the second adaptive filter and the first summation unit are added in the second summation unit, whereby a first processed input signal is provided as output from the second summation unit.

12. The hearing aid system according to claim 10 further comprising:

a second all-pass filter, third and fourth adaptive filters, second signal processor, third and fourth summation point, wherein the hearing aid system is further configured such that the output signal from the first summation point is provided, in a sixth branch, to the second all-pass filter and, in a seventh branch, to the second signal processor, and in an eight branch, to the third summation unit, and wherein the second all-pass filter is configured to provide the same delay as the second signal processor, the output signal from the second all-pass filter is provided, in a ninth branch, to the third adaptive filter and, in a tenth branch, to the second adaptive filter coefficient calculator, the output signal from the third adaptive filter is provided to the third summation unit, hereby providing as output signal from the third summation unit the output signal from the third adaptive filter subtracted from the output signal from the first summation unit, the output signal from the third summation unit is provided to the second adaptive filter coefficient calculator, wherein the second adaptive filter coefficient calculator is adapted to determine the filter coefficients of the third adaptive filter, based on the output signals from the third summation unit and the second all-pass filter, the output signal from the second signal processor is provided to the fourth adaptive filter, wherein the fourth adaptive filter is provided with the same filter coefficients as the third adaptive filter, and the output signals from the second adaptive filter, the fourth adaptive filter and the third summation unit are added in the fourth summation unit, hereby providing a second processed input signal.

* * * * *